(12) United States Patent
Oh

(10) Patent No.: US 7,655,948 B2
(45) Date of Patent: Feb. 2, 2010

(54) LIGHT EMITTING DISPLAY

(75) Inventor: Kwang Sik Oh, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 98 days.

(21) Appl. No.: 11/455,517

(22) Filed: Jun. 19, 2006

(65) Prior Publication Data

US 2007/0096111 A1     May 3, 2007

(30) Foreign Application Priority Data

Sep. 5, 2005     (KR) ...................... 10-2005-0082418

(51) Int. Cl.
*H01L 31/00* (2006.01)
(52) U.S. Cl. .......................... 257/59; 257/72
(58) Field of Classification Search ................... 257/79, 257/350, 59, 72; 438/158
See application file for complete search history.

(56) References Cited

U.S. PATENT DOCUMENTS

| | | | | |
|---|---|---|---|---|
| 5,710,606 A | * | 1/1998 | Nakajima et al. | 349/42 |
| 6,614,076 B2 | * | 9/2003 | Kawasaki et al. | 257/350 |
| 7,122,845 B2 | * | 10/2006 | Uchida | 257/89 |
| 2003/0205763 A1 | * | 11/2003 | Park et al. | 257/359 |
| 2004/0017151 A1 | * | 1/2004 | Kim et al. | 313/504 |

FOREIGN PATENT DOCUMENTS

| | | |
|---|---|---|
| CN | 1196832 A | 10/1998 |
| CN | 1479559 A | 3/2004 |
| JP | 2001-267578 A | 9/2001 |
| JP | 2003-59654 A | 2/2003 |
| JP | 2003-323986 A | 11/2003 |
| JP | 2005-196111 A | 7/2005 |

OTHER PUBLICATIONS

Office Action issued in corresponding Chinese Patent Application No. 200610091898.3; issued Jun. 6, 2008.
Office Action issued in corresponding Japanese Patent Application No. 2006-156345; issued Feb. 3, 2009.

\* cited by examiner

*Primary Examiner*—Mark Prenty
(74) *Attorney, Agent, or Firm*—Brinks Hofer Gilson & Lione

(57) ABSTRACT

The present disclosure provides a light emitting display device including a first substrate and a second substrate and a light emitting part disposed therebetween. The first substrate includes an active layer, source and drain electrodes, an insulating layer, and a gate electrode. The active layer is doped with first dopant ions and second dopant ions. The light emitting display may have a fast response characteristic due to a reduced resistance of the active layer and an improved characteristic of current drift.

4 Claims, 4 Drawing Sheets

LIGHT EMITTING DISPLAY

This nonprovisional patent application claims priority under 35 U.S.C. § 119(a) to Patent Application No. 2005-0082418 filed in Korea on Sep. 5, 2005, the entire contents of which are hereby incorporated by reference.

TECHNICAL FIELD

The present disclosure relates to a light emitting display associated with a response characteristic.

BACKGROUND

An active light emitting device used for a light emitting display may have a light emitting layer formed between two electrodes. The light emitting device can be classified as an inorganic light emitting device or an organic light emitting device depending on material. The light emitting device may further be classified as a passive matrix type or an active matrix type, depending on a driving mode of the light emitting layer.

FIG. 1 is a conventional light emitting device including a driver 10 formed on a fist transparent substrate 12, and a first electrode 16, a light emitting layer 18, and a second electrode 20 provided on the driver 10. In order to protect the device against moisture and oxygen, a getter unit 22 is formed on the second substrate 28, and the first and second substrates 12 and 28 are sealed by a sealant 26.

In the driver 10, the gate electrode 31 is formed on the first substrate 12, and a gate insulating film 32 is formed on the first substrate 12 to cover the gate electrode 31. An active layer 35 is formed of amorphous silicon (a-Si) or polycrystalline (poly) silicon (P—Si) on the gate insulating film 32, and an ohmic contact layer 34 is formed on the active layer 35. A source electrode 36 and a drain electrode 37 are formed on the active layer 35.

A protective film 38 can be selectively formed on the first substrate 12 comprising the source and drain electrodes 36 and 37. In detail, the drain electrode 37 electrically connects with the first electrode 16 through a contact hole which exposes a predetermined region of the drain electrode 37. The first electrode 16 electrically connects with a light emitting layer 18 as a pixel electrode.

Electrical current caused by driving will be described below with reference to FIG. 2.

When voltage is applied to the gate electrode 31, a channel is formed in the active layer 35 by the voltage of the gate electrode 31. Current (I) applied to the source electrode 36 flows to the drain electrode 37 along a low resistance layer formed in the channel. Since the active layer 35 is formed on amorphous silicon or poly silicon, the driver 10 has a characteristic in which a channel region formed by the gate electrode 31 has a relatively high resistance.

For description of resistance characteristic, it is assumed that resistance of the channel formed by the voltage of the gate electrode 31 is denoted by "R1." Also, it can be appreciated that the following resistance characteristic is provided on the assumption that a resistance formed at a lower surface of the source electrode 36 is denoted by "R2," and a resistance formed in the active layer 35 is denoted by "R3."

When a voltage is applied to the gate electrode 31, the current density (I) between a source and a drain through the channel decreases due to the series resistance of R1+R2+R3. This means that the mobility between the source and the drain through the channel decreases. As a result, a response characteristic of an active current-driven organic light emitting device deteriorates.

Such a deterioration of the response of a current-driven display that uses a light emitting device such as an organic light emitting device or an inorganic light emitting device may impair the performance of the display.

SUMMARY

Accordingly, the light emitting display of the present disclosure may solve some of the problems and disadvantages of the related art.

In one aspect, there is provided a light emitting display comprising a first substrate, a second substrate, and a connection electrode. The first substrate has a gate electrode, a gate insulating layer, an active layer, a source electrode, a drain electrode, and a doping region. The gate electrode is disposed on the first substrate. The gate insulating layer is disposed on the gate electrode. The active layer is disposed on the gate insulating layer and is doped with first dopant ions. The source electrode is formed at a first side of the active layer, and the drain electrode is formed at a second side thereof. The doping region comprises a predetermined portion of the active layer exposed between the source and drain electrodes. The predetermined portion is doped with second dopant ions. The second substrate has a first electrode, a light emitting part and a second electrode. The first electrode is formed on the second substrate. The light emitting part is formed on the first electrode. The second electrode is formed on the light emitting part. The connection electrode electrically connects the drain electrode of the first substrate with the second electrode of the second substrate.

In another aspect, there is provided a light emitting display comprising a first substrate, a second substrate, and a connection electrode. The first substrate has an active layer, source and drain electrodes, an insulating layer, and a gate electrode. The active layer is disposed on the first substrate and is doped at its center with first dopant ions and at its sides with second dopant ions. The source and drain electrodes are disposed at respective sides of the active layer. The insulating layer is disposed on the active layer and has contact holes for exposing predetermined regions of the source and drain electrodes. The gate electrode is disposed on the insulating layer to correspond with the active layer. The second substrate has a first electrode disposed thereon, a light emitting part disposed on the first electrode, and a second electrode disposed on the light emitting part. The connection electrode electrically connects the drain electrode of the first substrate with the second electrode of the second substrate.

In a further aspect, there is provided a light emitting display comprising a driver, a first electrode, a light emitting part, and a second electrode. The driver has a gate electrode, a gate insulating layer, an active layer, a source electrode, a drain electrode, and a doping region. The gate electrode is disposed on a substrate. The gate insulating layer is disposed on the gate electrode. The active layer is disposed on the gate insulating layer and is doped with first dopant ions. The source electrode is dispose at a first side of the active layer and the drain electrode is formed at a second side thereof. The doping region comprises a predetermined portion of the active layer exposed between the source and drain electrodes. The predetermined portion is doped with second dopant ions. The first electrode electrically connects with the drain electrode of the driver. The light emitting part is disposed on the first electrode. The second electrode is disposed on the light emitting part.

In a further aspect, there is provided a light emitting display comprising a driver, a first electrode, a light emitting part, and a second electrode. The driver has an active layer, source and drain electrodes, an insulating layer, and a gate electrode. The active layer is formed on a substrate and is doped at its center with first dopant ions and at its sides with second dopant ions. The source and drain electrodes are formed at respective sides of the active layer. The insulating layer is disposed on the active layer and has contact holes for exposing predetermined regions of the source and drain electrodes. The gate electrode is formed on the insulating layer to correspond with the active layer. The first electrode electrically connects the drain electrode of the first substrate with the second electrode of the second substrate. The light emitting part is formed on the first electrode. The second electrode is formed on the light emitting part.

DETAILED DESCRIPTION

Various embodiments will be described in a more detailed manner with reference to the drawings.

First Embodiment

Figure 1:
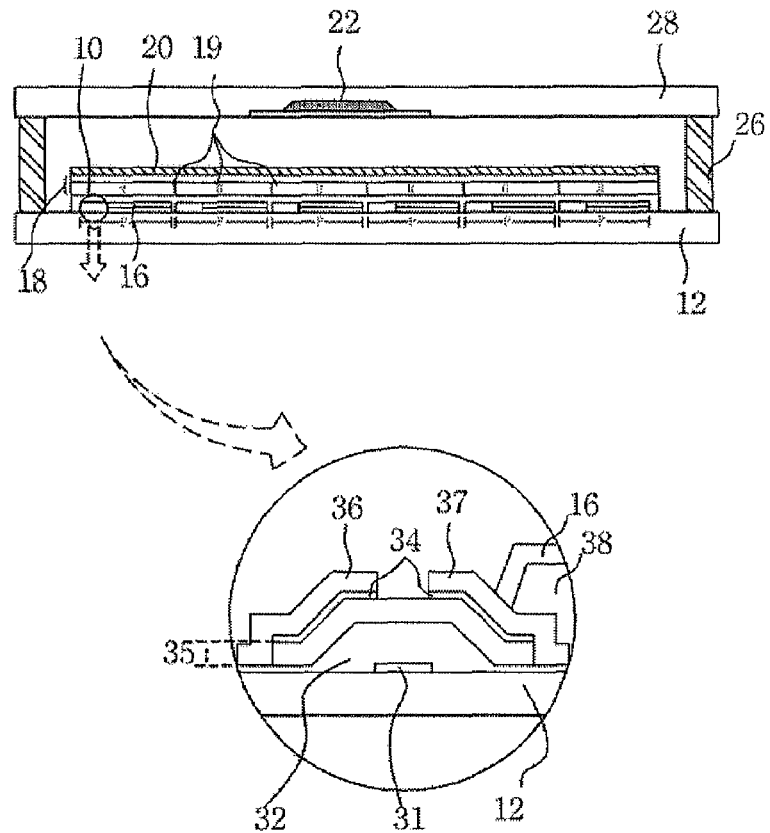
FIG. 1 is a view illustrating a conventional light emitting display and an exploded view illustrating a driver.
Figure 2:
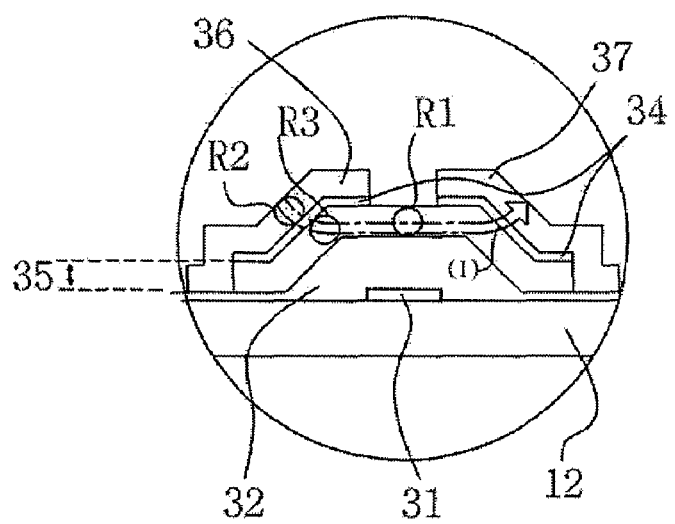
FIG. 2 illustrates current drift of the driver of FIG. 1.
Figure 3:
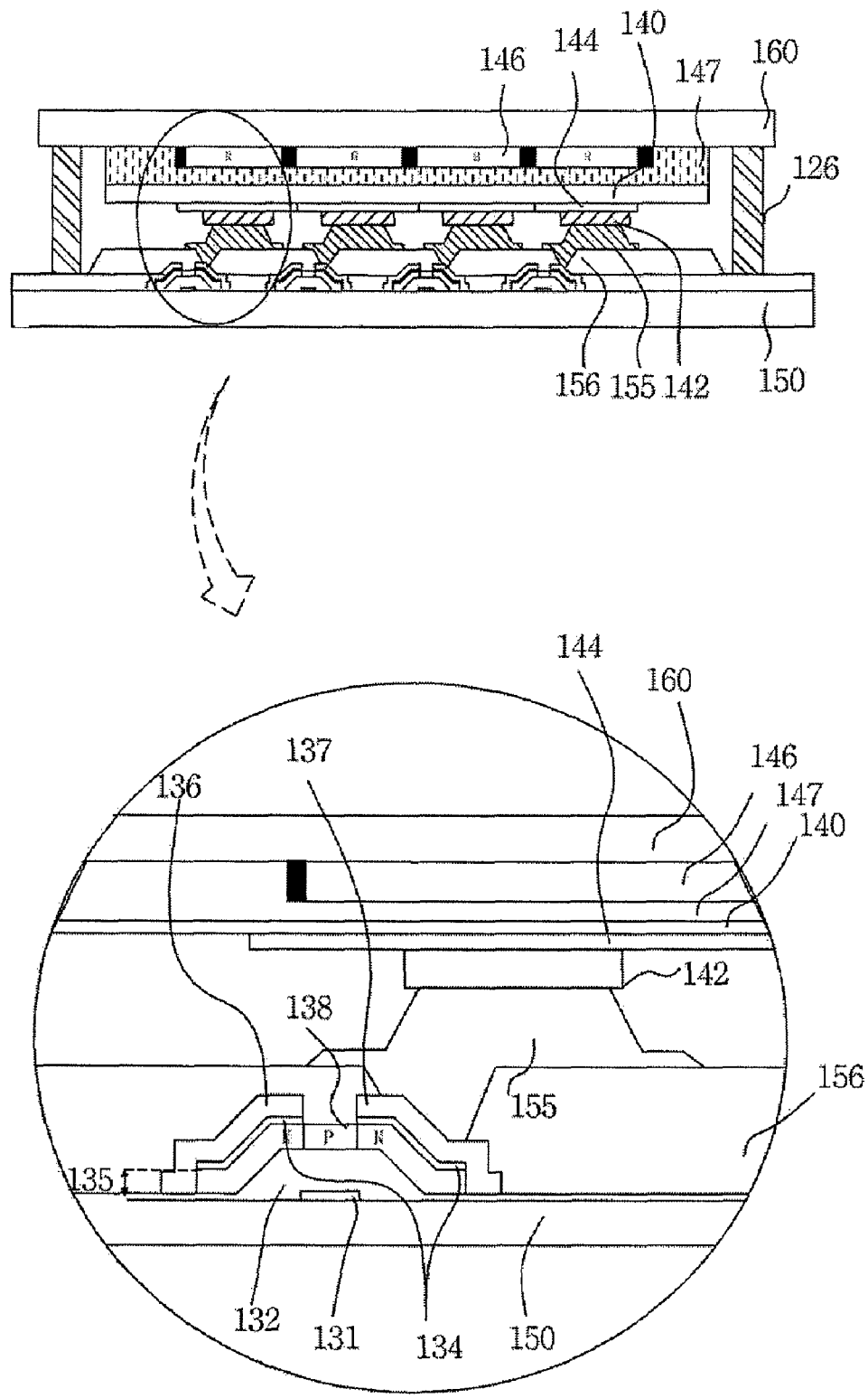
FIG. 3 is a view illustrating a light emitting display and an exploded view illustrating a driver according to a first exemplary embodiment.

FIG. 3 is a view illustrating a light emitting display and an exploded view illustrating a driver according to a first exemplary embodiment.

Referring to FIG. 3, the light emitting display according to the first embodiment has an upper substrate and a lower substrate. A gate electrode 131 may be formed under a source electrode 136 and a drain electrode 137.

The gate electrode 131 may be formed on a first substrate 150, and an insulating layer 132 may be formed to cover the gate electrode 131.

An active layer 135 doped with first dopant ions may be formed on the insulating layer 132 to cover the insulating layer 132. An ohmic contact layer 134 may be formed on the active layer 135. A source electrode 136 may be formed on one side of the active layer 135, and a drain electrode 137 may be formed on the other side thereof.

The active layer 135 is exposed between the source electrode 136 and the drain electrode 137. The exposed region of the active layer 135 may be doped with second dopant ions. This region is called a doping region 138.

A protective film 156 may be formed on the source electrode 136 and the drain electrode 137 such that a predetermined portion of the drain electrode 137 is exposed to the outside. The drain electrode 137 may be electrically connected with a connection electrode 155.

In a structure having the upper and the lower substrates, a first electrode 140 may be formed over a second substrate 160, and a light emitting part 144 may be formed on the first electrode 140, and a second electrode 142 may be formed on the light emitting part 144.

The first and the second substrates 150 and 160 are electrically connected by the connection electrode 155, which electrically connects the drain electrode 137 of the first substrate 150 with the second electrode 142 of the second substrate 160, and are sealed by a sealant 126, thereby constructing the light emitting display.

In the above structure, a planarization layer 147 may be formed on the first electrode 140, and each color filter 146 may be additionally formed as well.

Therefore, a thin film transistor of the first embodiment may have a characteristic of N-P-N by doping with the first dopant ions of an N type and the second dopant ions of a P type.

In other words, amorphous silicon or poly silicon for forming the active layer 135 may be doped with the N type dopants and may thus be N type region. P type dopants may dope the doping region 138 between the source and the drain electrodes 136 and 137 and thus the doping region 138 may be a P type region. As a result, an N-MOS thin film transistor may be constructed.

Referring to FIG. 3, the first substrate 150 may be defined as the lower substrate, and the second substrate 160 may be defined as the upper substrate.

Figure 4:
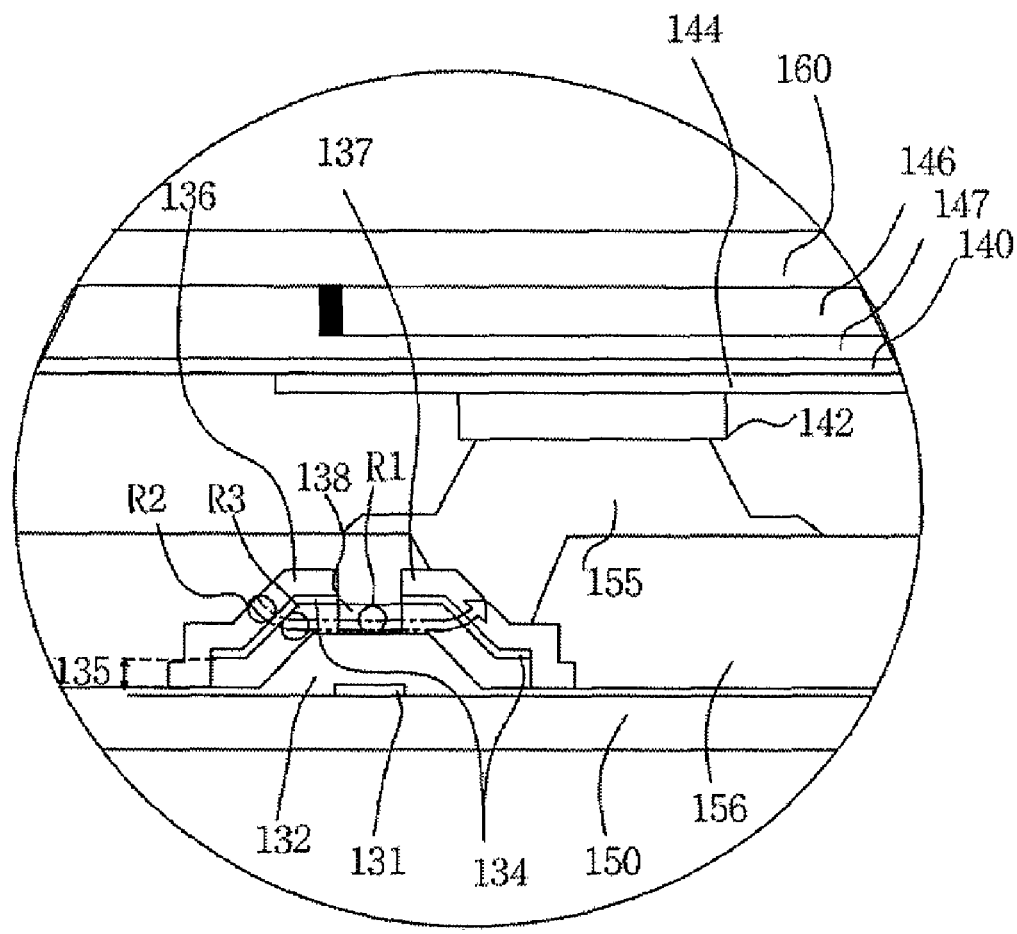
FIG. 4 illustrates current drift of the driver of FIG. 3.

Referring to FIGS. 3 and 4 showing a driver current, driving of the light emitting display according to the present embodiment will be described below.

If a voltage is applied to the gate electrode 131 formed on the first substrate 150, a channel may be formed in the P-type doping region 138 that is positioned over the gate electrode 131. Electric current may flow from the source electrode 136 to the drain electrode 137 through the channel.

Meanwhile, since the active layer 135 may be formed as N type under the source and the drain electrodes 136 and 137, an amount of current flowing through the channel may be increased. Further, since the doping region 138 may be formed as a P type region, electrons of the source electrode 136 may be quickly led due to holes of the doping region 138.

Accordingly, due to a characteristic of moving surface charges from the N type active layer 135 to a depletion layer of the doping region 138 having the holes, mobility between the source and the drain through the channel may be greatly improved.

Also, there is an effect in which, even by the N type dopants of the drain electrode 137, electrons are greatly introduced from the doping region 138 having the P type dopants, and a current density through the channel provided in the active layer 135 may be increased.

Since the channel formed in the doping region 138 is proportional to the voltage applied to the gate electrode 131, as the voltage applied to the gate electrode 131 increases, the depletion layer formed in the channel and electron introduction may be increased in proportion to the applied voltage.

It may be assumed that "R1" denotes a resistance formed in the doping region 138 doped with the P type dopants when the voltage is applied to the gate electrode 131. Also, it may be assumed that "R2" denotes a resistance formed at a lower end of the source electrode 136, and "R3" denotes a resistance formed in the active layer 135.

It should be noted that the respective resistances are based on a theoretical analysis not shown in the drawings.

When R1+R2+R3=Rs, a series resistance (Rs) of the active layer 135 formed of amorphous silicon may be reduced.

Accordingly, it can be appreciated that the active layer 135 may be doped with the N type and P type dopants, respectively, thereby reducing the series resistance (Rs) and improving a characteristic of current. Also, owing to the improvement of the characteristic of the current, a charge accumulation time may be reduced and at the same time, a high current density may be maintained, thereby increasing a response speed of the current-driven light emitting display.

Second Embodiment

Figure 5:
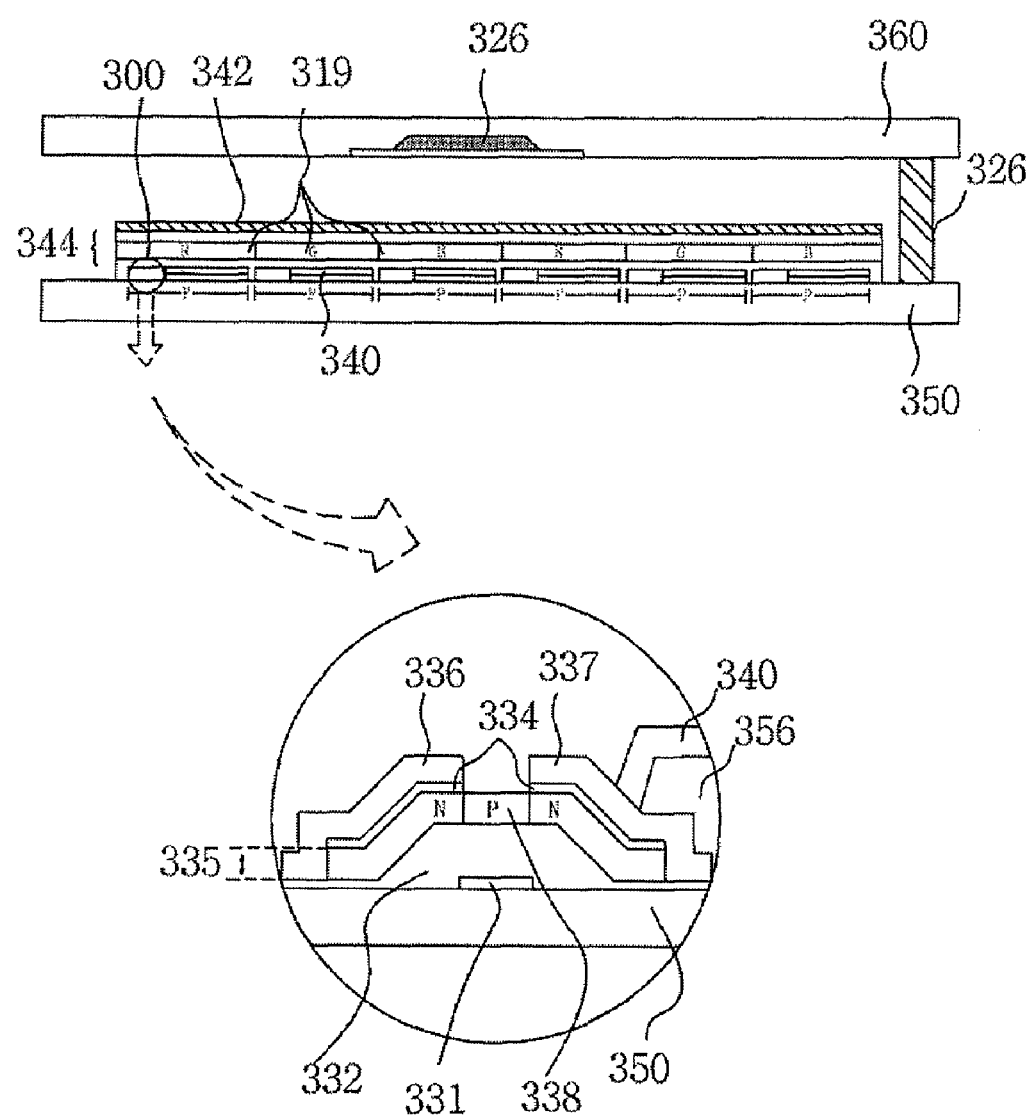
FIG. 5 is a view illustrating a light emitting display and an exploded view illustrating a driver according to a second exemplary embodiment.

FIG. 5 is a view illustrating a light emitting display and an exploded view illustrating a driver according to a second exemplary embodiment.

As shown in FIG. 5, the light emitting display according to the third exemplary embodiment of is structured to have a driver 300 and a light emitting part 344 formed at a substrate 350. A schematic structure in which a gate electrode 331 may be formed under a source electrode 336 and a drain electrode 337 is provided as follows.

The gate electrode 331 may be formed on the substrate 350, and a gate insulating layer 332 may be formed on the substrate 350 to cover the gate electrode 331.

An active layer 335 doped with first dopant ions may be formed to cover the gate insulating layer 332. An ohmic contact layer 334 may be formed on the active layer 335. The source electrode 336 may be formed on one side of the active layer 335, and the drain electrode 337 may be formed on the other side thereof.

A region of the active layer 335 exposed between the source electrode 336 and the drain electrode 337 may be doped with second dopant ions. This region is called an doping region 338. A protective film 356 may be formed on the drain electrode 337 such that a predetermined portion of the drain electrode 337 is exposed to the outside.

Here, the driver 300 in which the drain electrode 337 is electrically connected with a first electrode 340 may be formed.

Accordingly, the first electrode 340 may be electrically connected with the drain electrode 337 of the driver 300, the light emitting part 344 may be formed on the first electrode 340, and a second electrode 342 may be formed on the light emitting part 344, thereby providing the light emitting display in which sealing is implemented by a sealant 326.

The light emitting part 344 may express red (R), green (G), and blue (B) colors 319. In a general method, separate organic material for emitting red, green, and blue lights may be patterned and used at each pixel.

A selective constituent element of the light emitting display according to the third exemplary embodiment, a thin film transistor, may have a characteristic of N-P-N by doping with the first dopant ions of an N type and the second dopant ions of a P type.

In other words, amorphous silicon or poly silicon for forming the active layer 335 may be doped with N type ions and may be an N type region. P type ions may dope the doping region 338 between the source and drain electrodes 336 and 337, and the region may be a P type region. As a result, a thin film transistor may be constructed.

Driving of the light emitting display according to the third exemplary embodiment will be described below.

If a voltage is applied to the gate electrode 331 formed on the substrate 350, a channel may be formed in the P-type doping region 338 that is positioned over the gate electrode 331. At this time, electric current may flow from the source electrode 336 to the drain electrode 337 through the channel.

Since the active layer 335 may be formed as an N type region under the source and drain electrodes 336 and 337, an amount of current applied to and flowing in the source electrode 336 may be increased.

Accordingly, since the doping region 338 may be formed as a P type region, electrons of the source electrode 336 is quickly led due to holes of the doping region 338.

This may be due to a characteristic in which holes of surface charges move from the N type active layer 335 to the doping region 338 and accordingly, current mobility may be greatly improved.

Also, there is an effect in which, even by the N type ions of the drain electrode 337, electrons are greatly introduced from the doping region 338 having the P type ions, and a density of current flowing through the channel provided in the active layer 335 is increased.

Since the channel formed in the doping region 338 is be proportional to the voltage applied to the gate electrode 331, as the voltage applied to the gate electrode 331 increases, the depletion layer formed in the channel and electron introduction may be increased in proportion to the applied voltage.

It may be assumed that "R1" denotes resistance formed in the doping region 338 doped with the P type ions when the voltage is applied to the gate electrode 331. Also, it may be assumed that "R2" denotes resistance formed at a lower end of the source electrode 336, and "R3" denotes resistance formed in the active layer 335.

It should be noted that the respective resistances are based on theoretical analysis not shown in the drawings.

When R1+R2+R3=Rs, the series resistance (Rs) of the active layer 335 formed of amorphous silicon may be reduced.

Accordingly, it can be appreciated that the active layer 335 may be doped with the N type and P type ions, respectively, thereby reducing the resistance (Rs) and improving a characteristic of current drift. Also, owing to improvement of the characteristic of the current drift, a charge accumulation time may be reduced and at the same time, high current density may be maintained, thereby increasing a response speed of the current-driven light emitting display.

The present disclosure has described various embodiments, which may be varied in many ways. Such variations are not to be regarded as a departure from the spirit and scope of the invention, and all such modifications as would be obvious to one skilled in the art are intended to be included within the scope of the following claims.

What is claimed is:

1. A light emitting display comprising:
a first substrate having a gate electrode formed thereon, a gate insulating layer formed to cover the gate electrode, an active layer formed on the gate insulating layer and having first and second regions doped with first conductive impurity ions, and a third region doped with second conductive impurity ions between the first and second regions, a source electrode formed on the first region of the active layer and a drain electrode formed on the second region of the active layer, wherein the source electrode entirely covers the first region of the active layer and the drain electrode entirely covers the second region of the active layer;
a second substrate having a first electrode formed thereon, a light emitting part formed on the first electrode, and a second electrode formed on the light emitting part; and
a connection electrode for electrically connecting the drain electrode of the first substrate with the second electrode of the second substrate.

2. The display of claim 1, wherein the first conductive impurity ions are doped in an N type, and the second conductive impurity ions are doped in a P type.

3. The display of claim 1, wherein the first conductive impurity ions are doped in a P type, and the second conductive impurity ions are doped in an N type.

4. The display of claim 1, wherein the light emitting part comprises an organic light emitting layer.

* * * * *